United States Patent [19]

King et al.

[11] Patent Number: 4,685,210

[45] Date of Patent: Aug. 11, 1987

[54] MULTI-LAYER CIRCUIT BOARD BONDING METHOD UTILIZING NOBLE METAL COATED SURFACES

[75] Inventors: Michael M. King, Vashon; Helen J. Walter, Seattle, both of Wash.

[73] Assignee: The Boeing Company, Seattle, Wash.

[21] Appl. No.: 719,560

[22] Filed: Mar. 13, 1985

[51] Int. Cl.⁴ .................................... H05K 3/36
[52] U.S. Cl. .............................. 29/830; 29/852; 361/414
[58] Field of Search ............... 361/414; 29/852, 830, 29/846; 339/17 R, 17 M

[56] References Cited

U.S. PATENT DOCUMENTS

| | | |
|---|---|---|
| 2,718,690 | 9/1955 | Ulam . |
| 2,719,097 | 9/1955 | Balzers . |
| 3,148,356 | 9/1964 | Hedden, Jr. ............... 29/852 X |
| 3,205,297 | 9/1965 | Brock . |
| 3,325,691 | 6/1967 | Dahlgren et al. ........... 361/414 X |
| 3,442,003 | 5/1969 | Weir . |
| 3,446,908 | 5/1969 | Tally et al. ................ 174/68.5 |
| 3,484,533 | 12/1969 | Kauffman . |
| 3,499,218 | 3/1970 | Dahlgren et al. . |
| 3,532,801 | 10/1970 | Faulkner ................... 174/68.5 |
| 3,550,261 | 12/1970 | Schroeder . |
| 3,606,677 | 9/1971 | Ryan ....................... 29/830 |
| 3,619,896 | 11/1971 | Clarke . |
| 3,675,311 | 7/1972 | Wells . |
| 3,684,464 | 8/1972 | Happ et al. . |
| 3,786,559 | 1/1974 | Smith . |
| 3,813,258 | 5/1974 | Pieper et al. . |
| 4,068,022 | 1/1978 | Glick . |
| 4,128,671 | 12/1978 | Suggs . |
| 4,368,503 | 1/1983 | Kurosawa et al. .......... 361/414 |
| 4,591,220 | 5/1986 | Impey .................. 29/830 X |

FOREIGN PATENT DOCUMENTS

| | | | |
|---|---|---|---|
| 1164591 | 9/1969 | United Kingdom | 174/68.5 |
| 1273904 | 5/1972 | United Kingdom | 29/846 |

Primary Examiner—Howard N. Goldberg
Assistant Examiner—Carl J. Arbes
Attorney, Agent, or Firm—Schwartz, Jeffery, Schwaab, Mack, Blumenthal & Evans

[57] ABSTRACT

An electrically and mechanically sound conductive bond between layers of a multi-layer plated through hole circuit board is produced by depositing a layer of noble metal over the surfaces to be joined, juxtaposing the noble metal coated layers and subjecting them to a combination of pressure and heat for a sufficient period of time. Excellent results have been obtained in a multi-layer circuit board for a microstrip microwave antenna with 0.002 inch thick polished silver layers at bonding pressures of 490 to 575 psi and temperatures of 560 to 580 degrees F. for time periods of 20 to 30 minutes.

25 Claims, 3 Drawing Figures

MULTI-LAYER CIRCUIT BOARD BONDING METHOD UTILIZING NOBLE METAL COATED SURFACES

The United States Government has rights in this invention pursuant to Contract No. N60530-82-C-0016 awarded by the U.S. Navy.

FIELD OF THE INVENTION

This invention relates to multi-layer printed circuit boards. More specifically, the invention relates to multi-layer plated through hole printed circuit boards in which circuit elements on one layer are electrically connected with other circuit elements on a remote surface of another layer. The invention finds particular application in the construction of a multi-layer circuit board for a microstrip or stripline microwave antenna.

BACKGROUND OF THE INVENTION

The use of printed circuitry in which electronic components are formed on one or more surfaces of an insulating board is an established procedure in the electronics industry. For reasons of compactness, performance and appropriate interconnection between various components, multi-layer circuit board arrangements have been developed in which electrical components on one layer are interconnected with other components on a remote surface of another layer. An example of a multi-layer circuit board is disclosed in Dahlgren et al., U.S. Pat. No. 3,499,218. Interconnections between remote layer surfaces may be effected by means of plated through holes. That is to say, a hole is drilled through the circuit board layer between the circuit components to be connected and the interior of the hole is plated with a conductive material to establish a conductive path between the surfaces of the layer.

In the past, it has been attempted to mechanically and electrically connect the layers of a multi-layer circuit board to each other by soldering. Difficulties have been encountered, however, as a result of excessive solder flow which penetrates beyond the intended joint areas. Excessive solder flow may interfere with adhesive bonds established between nonelectrically conductive areas of adjacent layers and also may cause short circuits between different circuit elements of the printed circuitry. Accordingly, there is a need for improved bonding techniques which can establish an electrically and mechanically sound bond between adjacent layers of a multi-layer circuit board without any flow of conductive material beyond the desired conductive joint area.

Thermal compression bonding techniques are known in contexts unrelated to the present invention. For example, thermal compression bonding of dissimilar metals under vacuum is disclosed in Clarke, U.S. Pat. No. 3,619,896. Use of such techniques is unknown, however, to create a bond and electrically conductive path between two identical metals through one or more layers of non-conducting circuit board material in a multi-layer circuit board.

SUMMARY OF THE INVENTION

It is an object of the present invention to provide an improved method of bonding selected areas of the layers of a multi-layer circuit board to each other to establish an electrically and mechanically sound bond between the layers.

Another object of the present invention is to provide a bonding method which is especially suitable for bonding adjacent layers of a multi-layer plated through hole printed circuit board to each other.

A further object of the present invention is to provide a bonding method for multi-layer circuit boards which is highly compatible with printed circuit technology.

A still further object of the present invention is to provide a technique for forming conductive joints between layers of a multi-layer printed circuit board which will not interfere with or cause short circuits in the circuitry on the board layers.

It is also an object of the present invention to provide a method for forming conductive joints between layers of a multi-layer printed circuit board which is compatible with formation of adhesive bonds between the circuit board layers.

An additional object of the present invention is to provide a method of bonding together the layers of a multi-layer circuit board with plated through hole electrical connections between layers in which lamination of all the circuit board layers may be effected in a single step.

Yet another object of the invention is to provide an improved multi-layer printed circuit board with plated through hole electrical connections between remote layer surfaces.

These and other objects of the invention are achieved by providing a method of forming an electrically and mechanically sound joint between internal layers of a multi-layer plated through hole printed circuit board comprising the steps of applying a noble metal coating to selected layer surfaces to be joined, juxtaposing the noble-metal coated surfaces, and exposing the juxtaposed layers to a pressure from about 100 psi to about 10,000 psi and a temperature from about 400 to about 1,000 degrees F. until the noble metal coated surfaces bond to form an electrically and mechanically sound metal to metal joint.

In another aspect of the invention, the objects are achieved by providing a multi-layer circuit board comprising a plurality of board layers; a first circuit element on a surface of one board layer; a second circuit element on a remote surface of another board layer; at least one plated through hole extending from said first circuit element to said second circuit element through at least one intervening board layer; and a conductive noble metal layer in the plated through hole portion of each intervening board layer traversed by said plated through hole and covering a desired bonding pad area around said plated through hole on each intervening board layer surface; said conductive noble metal layer being bonded by the combined action of pressure and heat to a layer of said noble metal on an adjacent circuit board to establish an electrically sound connection between said first circuit element and said second circuit element and a mechanically sound connection between said one board layer and said another board layer.

BRIEF DESCRIPTION OF THE DRAWINGS

The invention will be described in further detail with reference to the accompanying drawings wherein.

DETAILED DESCRIPTION OF A PREFERRED EMBODIMENT

Figure 1:
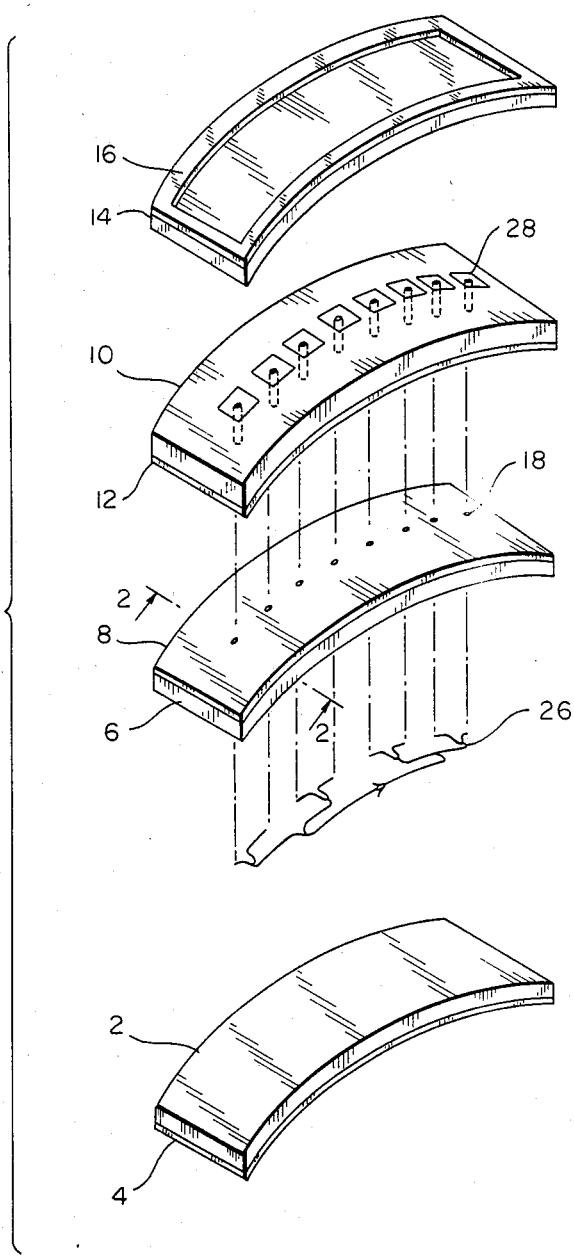
FIG. 1 is an exploded simplified schematic representation of the layers of a four-layer circuit board used in a microstrip microwave antenna.

The invention will be described in detail with reference to a multi-layer printed circuit board for a microstrip microwave antenna. An exploded representation of the antenna comprising four circuit board layers is shown in FIG. 1. The board layers may be formed of any of the conventional circuit board materials such as fiberglass reinforced synthetic resins. In the described embodiment, fiberglass reinforced polytetrafluoroethylene boards have been used, but it should be understood that other circuit board materials such as fiberglass impregnated with epoxy, polyurethane, or polyimide resins might also have been used.

In the described embodiment, each of the circuit board layers comes with a thin layer of copper cladding, for example 0.0007 inch thick, applied by the material manufacturer. This original copper cladding is referred to as vendor copper. It is used as a basis for the ground planes and bonding pads of the microwave antenna.

As noted above, the microwave antenna comprises four circuit board layers: a bottom layer 2 with a layer of copper cladding 4 on the underside thereof; a lower intermediate layer 6 with a copper layer 8 on the top surface thereof; an upper intermediate layer 10 with a copper layer 12 on the lower surface thereof, and a top circuit board layer 14 with a layer of copper cladding 16 around the margin of the top surface thereof. Copper layer 4 forms a base for the lower ground plane of the microwave antenna which underlies the circuitry formed on the bottom of circuit board layer 6 as will be described hereinafter. If desired, an additional thickness of copper may be plated onto the surface of the vendor copper to provide a thicker ground plane. Copper layers 8 and 12 together form a basis for the upper ground plane which overlies the circuitry formed on the bottom of circuit board layer 6, and they also form the basis for the bonding pads of the electrical connection to be established through the boards as described hereinafter. Copper layer 16 is optional and might be omitted if desired.

At the outset of production, blanks are cut from the circuit board material and provided with appropriate tooling holes, registration slots and the like to facilitate subsequent manufacturing. Through holes 18 are then drilled in the intermediate layers 6 and 10 using numerically controlled machine tools at the locations where electrical connections are to be established through the boards. It is understood that mode suppression arcs useful in achieving good antenna performance may also be routed in the board material of layers 2 and 6 around the through hole locations. Such mode suppression arcs are not involved in the bonding method of the present invention and have been omitted from the drawings for reasons of clarity.

When it is desired for the microwave antenna to have an arcuate shape, each of the circuit board layers is given a curved configuration by passing it through a conventional roll former.

A conductive path is then formed through each of the through holes drilled through circuit board layers 6 and 10 by subjecting each of the layers to electroless copper plating until a conductive copper coating 20 is formed on the wall of each of the through holes 18. After an initial thin conductive layer through each hole is established, a thicker layer may be built up by other electroplating techniques, e.g., strike plating. Simultaneously, additional copper layers 22 and 24 are applied over the vendor copper layers 8 and 12, respectively, to increase the thickness of the upper ground plane. The thickness of the copper conductive path in the plated through hole may range from about 0.0005 to about 0.005 inch. Desirably, the thickness of the copper conductive path in the plated through hole will lie in the range from about 0.0007 to about 0.002 inch. In a particularly preferred embodiment, copper through hole conductive paths having a thickness of approximately 0.001 inch have been used with good results. Areas which are not to be plated with copper, such as portions of the lower surface of circuit board layer 6 and of the upper surface of circuit board layer 10 may be protected as desired with conventional plating resists, which are removed after the copper plating steps are completed.

Circuit elements are then developed on the surface of the board layers. The circuitry may be applied by techniques conventionally used to produce printed circuits, such as conventional photoresist application, imaging and developing, plating and/or etching and stripping steps. In the illustrated microstrip microwave antenna, a stripline circuit 26 is developed on the lower surface of circuit board layer 6. A series of microstrip circuit elements 28 are developed on the upper surface of circuit board layer 10.

Clearance rings are developed on the copper layers on the top of circuit board layer 6 and on the bottom of circuit board layer 10 around each plated through hole 18. The copper in each ring is etched away to produce a clearance ring 30, for example a ring approximately 0.07 inch wide, which separates an annular ring of copper 32 around the plated through hole from the rest of the copper layer 24. Copper ring 32 forms the base of a bonding pad 34 for the electrical connection between the stripline circuit on the bottom of circuit board layer 6 and the microstrip elements on the top of circuit board layer 10. The remainder of copper coatings 22 and 24 form the base of the upper ground plane previously alluded to. Clearance rings 30 serve to separate the electrical connection through board layers 6 and 10 from the upper ground plane. This arrangement is shown in enlarged detail in FIG. 3.

The etching resist is thereafter removed and the stripline circuit on the bottom of circuit board layer 6 and microstrip circuit elements on the top of circuit board layer 10 are masked with a protective layer. The protective mask layer serves to shield the circuit elements during subsequent application of a noble metal used as a bonding material. Commercially available polymeric etching resists may be used. Selection of a suitable masking material to protect the circuitry during subsequent metal plating is within the skill of the art. For example, a suitable protective mask material is sold under the trademark "ADCOTE". To conserve noble metal, those portions of copper layers 20 which lie on the top of board layer 10 and on the bottom of board layer 6 are also masked prior to noble metal plating.

A layer of noble metal bonding material is then applied over the copper conductive paths 20 in the plated through holes, the copper bonding pads 32 at the mouths of the plated through holes, and the copper layers 22 and 24 which form the upper ground plane. Suitable noble metals include gold, silver, platinum and palladium. The use of silver is particularly preferred. The noble bonding metal layer may be applied by any of a variety of techniques such as vacuum deposition, sputtering, painting, or any of various plating methods. Use of a panel plating technique is considered particularly desirable because of the general compatibility of the technique with the other process steps utilized in the production of the multi-layer circuit board of the microstrip microwave antenna.

Figure 3:
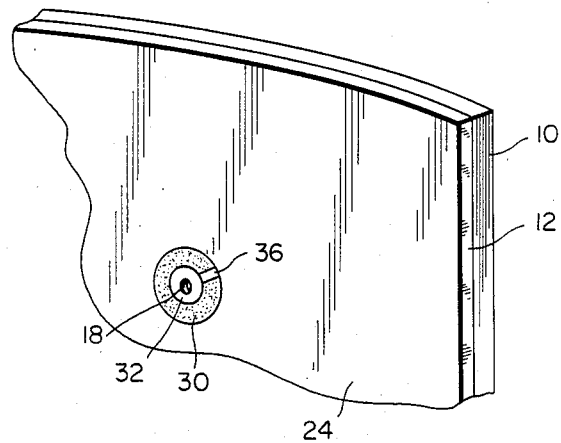
FIG. 3 is an enlarged detail view of a plated through hole showing temporary electrical connection between the bonding pad and the ground plane across the surrounding clearance ring preparatory to noble metal plating.

In order to assure satisfactory plating of the noble metal bonding material on the plated through hole conductive path and the bonding pad at the mouth of the plated through hole, it is necessary to assure good electrical contact between these board portions and the cathode of the plating cell. This is advantageously achieved by establishing a good electrical jumper connection between the bonding pad base and the ground plane base since the ground plane base is readily connectable to the plating cell cathode by means of an alligator clip or the like. The required electrical connection may be achieved by extending a piece of wire through the plated through holes, by leaving a tiny conductive bridge between the ground plane and the bonding pad when the clearance ring is etched, by using special connecting pins, or by any of a number of other techniques. A particularly preferred technique of establishing the requisite electrical jumper connection is to paint a tiny strip 36 of silver paint across the clearance ring between the ground plane layer 22 or 24 and the bonding pad base 32 as shown in FIG. 3. After the plating operation, this narrow strip of silver paint can be readily removed without appreciable damage to the bonding metal layer.

Plating or other application of the noble bonding metal is carried out until a uniform noble metal layer 38 is formed over the conductive path 20 through each plated through hole and over each copper bonding pad base 32. Similar noble metal bonding layers 40 and 42 are formed over the copper base layers 22 and 24, respectively, of the upper ground plane. The thickness of the noble metal bonding layer may range broadly from about 0.0001 to 0.01 inch; preferably from about 0.0005 to about 0.005 inch. Most preferably, the thickness of the noble bonding metal layer will lie in the range from about 0.001 to about 0.004 inch. Excellent results have been achieved with a bonding layer having a thickness of approximately 0.002 inch.

In the case of silver, the panel plating method of Rasmussen may be used to excellent advantage. The copper layers are first degreased as necessary in a standard degreasing solution, and the surface is then scrubbed with an abrasive pad, such as a commercial scouring pad sold by the 3M Company under the trademark "SCOTCHBRITE". After wiping and drying the surface, the part is anodically connected and immersed in an anodizing bath containing about 0.27 Molar potassium carbonate and about 0.80 Molar potassium cyanide in deionized water for 1 to 2 minutes at about 0.7 to 0.8 volts. The part is disconnected from the anodizing bath and immediately immersed and rinsed in a bath having the same make-up as the anodizing bath. Then it is connected to a cathode for electroplating and is immersed without further rinsing in a silver electroplating bath containing 0.27 Molar potassium carbonate, 0.80 Molar potassium cyanide and about 0.22 Molar silver cyanide in deionzied water. Electroplating may take place at a current density ranging from 1 to 20 ampres per square foot, preferably between about 2 and about 10 ampres per square foot. The temperature of the plating bath is in the range from about 70 to about 90 degrees F. Excellent results have been obtained at a plating current density of approximately 4 ampres per square foot. Under such conditions, a plating time of approximately 3 hours is sufficient to deposit a 2 mil (0.002 inch) thick silver bonding and conducting layer over the copper layers. The grain size of the deposited silver may be controlled to a degree by adjustment of the current. The plated silver layer may have a matte, bright or semi-bright finish. Excellent bonding results have been achieved with matte finish layers.

Plating conditions for applying coatings of noble metals other than silver can be worked out by persons skilled in the art.

The protective masks over the circuit elements are removed by vapor degreasing.

Following the noble metal plating operation, the deposited noble metal layer may optionally be polished to improve subsequent bonding. Polishing may be effected with a light wire brush or synthetic bristle brush. Use of a polishing aid, such as a slurry of pumice particles, has been found to be advantageous. Particularly good bonding results have been obtained with silver layers which have been polished with a rotary nylon brush and a slurry of alumina particles.

If desired, the plated silver bonding layer may optionally be cleaned by immersion in an oxidizing bath. The metal oxide formed in the cleaning bath is reconverted to free metal as a result of the application of heat and pressure during the subsequent lamination step.

Also, if desired, the application of bonding metal may be carried out so that the bonding pads 34 surrounding the through holes are slightly raised, that is to say the total thickness of the bonding pads is slightly greater than the thickness of the ground plane layer. Desirably, the difference in thickness should not excede 0.5 mil (0.0005 inch). If the difference in thickness is too great, it is possible that the conductive path in the plated through hole may be damaged during the subsequent laminating step.

After the noble metal bonding layer has been prepared, the layers of the multi-layer microwave antenna circuit board are laid up for lamination. The noble metal coated upper layer of circuit board layer 6 and the noble metal coated bottom layer of circuit board layer 10 are juxtaposed with the noble metal bonding layers in contact with each other. In order to secure the bottom circuit board layer 2 in place underneath stripline circuit 26 and the top circuit board layer 14 in place over microstrip circuit elements 28, sheets or films of thermal adhesive 44 are interposed between the layers. Suitable adhesives are known in the art. Particularly good results have been obtained using a fluorinated ethylene/propylene thermoplastic adhesive sold by the Dupont Company under the trademark "FEP".

The resulting assembly is disposed on the outer surface of a laminating drum having a curvature corresponding to the curvature of the microwave antenna and secured thereagainst by an appropriate clamp. A suitable mechanical clamp may be constructed by extending a band of metal over the assembly and around the laminating drum and tightening the band around the drum by means of screws extended between the ends of the band. Instead of a mechanical clamping assembly, suitable hydraulic or pneumatic pressure arrangements might also be used.

If desired, a pressure pad may be interposed between the clamping element and the lay up of circuit board layers in order to promote uniform application of the pressure across the surface of the microwave antenna assembly. A pad consisting of fiberglass impregnated with polytetrafluorethylene has been used with good results. The assembly is then subjected to a combination of heat and pressure for a period of time sufficient to achieve good bonds between the individual layers of the microwave antenna assembly. The applied pressure may range up to 10,000 psi. Generally, the applied pressure will lie in the range from about 100 to about 3,000 psi. It is preferred to use pressures from about 200 to about 1,000 psi, and particularly preferred to use a pressure in the range from about 490 to about 575 psi.

The laminating temperature may broadly range from about 400 to about 1000 degrees F. Good results have been achieved using temperatures in the range from about 450 to about 600 degrees F. It is preferred to use temperatures in the range from about 500 to about 580 degrees F, and particularly preferred to use temperatures in the range from about 560 to about 580 degrees F.

The lamination time may range from as little as 1 minute to as long as 24 hours or more. Generally, the laminating time will lie in the range from about 5 minutes to about 1 hour. Laminating times in the range from about 15 to about 45 minutes are preferred, and times in the range from about 20 to about 30 minutes are particularly preferred.

Figure 2:
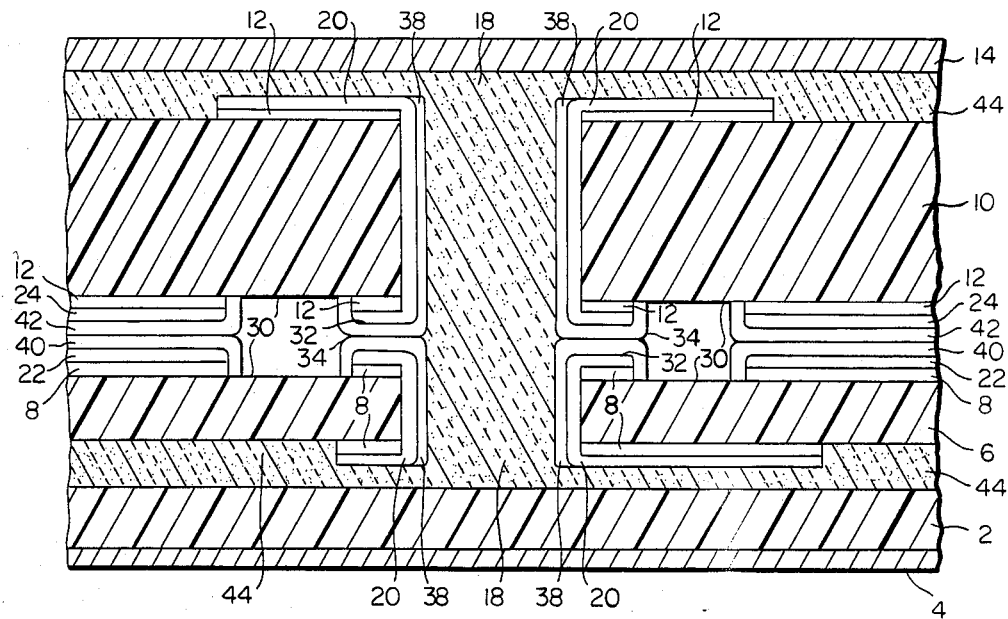
FIG. 2 is an enlarged sectional view through a conductive joint between the layers of the multi-layer circuit board of FIG. 1 after bonding.

During the application of heat and pressure, the silver layers 38 on the bonding pads 34 and the silver layers 40 and 42 on the ground plane bond to each other to form secure mechanical and electrical connections. As a result, the microstrip circuit elements 28 are each electrically connected to appropriate parts of stripline circuit 26 by the conductive layers 38 which extend through the plated through holes 18. Lower board 2 and upper board 14 are also connected to the assembly by the thermal adhesive 44. During lamination, some of the thermal adhesive 44 is extruded into the through hole 18. This further strengthens the mechanical joint between layers. The resulting joint is illustrated in sectional view in FIG. 2. It has been found that both an excellent metal to metal bond between the second and third layers and excellent adhesive bonds between the first and second layers and between the third and fourth layers can be produced using a pressure of approximately 500 psi and a temperature of approximately 575 degrees F for a period of about 30 minutes.

The lamination assembly may optionally be maintained under an inert atmosphere to prevent undesired contamination. An atmosphere of dry nitrogen could be used, for example. Ordinarily, use of a special protective atmosphere is not necessary.

After lamination, the multi-layer circuit board is subjected to conventional finishing steps such as trimming, application of protective coatings, addition of mounting elements and/or electrical connecting elements, and final inspection and testing. The method of the invention has been found to produce multi-layer circuit board microstrip microwave antennas exhibiting both excellent structural integrity and electrical performance.

The foregoing description has been set forth merely to illustrate the invention and is not intended to be limiting. Since modifications of the described embodiment incorporating the spirit and substance of the invention may occur to persons skilled in the art, the scope of the invention is to be limited solely with respect to the appended claims and equivalents.

What is claimed is:

1. A method of forming an electrically and mechanically sound joint between internal layers of a multi-layer plated through hole printed circuit board comprising the steps of:
    applying a coating of a noble metal to layer surfaces to be conductively joined on the through hole board layers;
    juxtaposing the noble metal coated surfaces on the through hole board layers;
    applying a layer of thermal adhesive over the outer surfaces of the juxtaposed through hole board layers;
    juxtaposing imperforate outer board layers over the adhesive layers; and
    exposing the juxtaposed layers to a pressure from about 100 psi to about 10,000 psi and a temperature from about 400 to about 1000 degrees F. until the noble metal coated surfaces bond to form an electrically and mechanically sound metal to metal joint and thermal adhesive is extruded into the through holes of the internal through hole board layers, thereby forming a multi-layer board with buried through hole interconnections.

2. A method according to claim 1, wherein the juxtaposed layers are subjected to heat and pressure for a time period from about 1 minute to about 24 hours.

3. A method according to claim 2, wherein said juxtaposed layers are subjected to pressure and heat for a period from about 5 minutes to about 1 hour.

4. A method according to claim 1, wherein said noble metal coating has a thickness in the range from about 0.0001 to about 0.01 inch.

5. A method according to claim 4, wherein said noble metal coating has a thickness in the range from about 0.0005 to about 0.005 inch.

6. A method according to claim 5, wherein said noble metal coating has a thickness in the range from about 0.001 to about 0.004 inch.

7. A method according to claim 1, wherein said noble metal is selected from the group consisting of silver, gold, platinum and palladium.

8. A method according to claim 6, wherein said noble metal is silver.

9. A method according to claim 1, wherein each layer of said multi-layer circuit board comprises a fiberglass reinforced polytetrafluoroethylene layer.

10. A method according to claim 9, wherein each layer of said multi-layer circuit board is copper clad.

11. A method according to claim 1, additionally comprising a step of applying a copper coating inside through holes of said circuit board layers before application of said noble metal coating, and wherein a noble metal coating is applied inside said through holes over said copper coating simultaneously with the application of said noble metal coating to the layer surfaces to be joined.

12. A method according to claim 11, wherein said copper coating is applied by plating.

13. A method according to claim 1, wherein said noble metal coating is applied by a technique selected from plating, vapor deposition, sputtering and painting.

14. A method according to claim 13, wherein said noble metal coating is applied by panel plating.

15. A method of forming an electrically and mechanically sound joint between internal layers of a multi-layer plated through hole printed circuit board comprising the steps of:
applying a coating of silver to the layer surfaces to be joined by electroplating at a current density of from about 2 to about 10 amp/ft$^2$ for a period from about 15 minutes to about 12 hours;
juxtaposing the noble metal coated surfaces;
exposing the juxtaposed layers to a pressure from about 100 psi to about 10,000 psi and a temperature from about 400 to about 1000 degrees F. until the noble metal coated surfaces bond to form an electrically and mechanically sound metal to metal joint.

16. A method of forming an electrically and mechanically sound joint between internal layers of a multi-layer plated through hole printed circuit board comprising the steps of:
applying a coating of a noble metal to the layer surfaces to be joined;
juxtaposed the noble metal coated surfaces; and
exposing the juxtaposed layers to a pressure from about 100 psi to about 10,000 psi and a temperature from about 400 to about 1000 degrees F. until the noble metal coated surfaces bond to form an electrically and mechanically sound metal to metal joint;
wherein an adhesive is interposed between surfaces of juxtaposed circuit board layers not coated with noble metal, and an adhesive bond is formed between such layers during the exposure of the layers to pressure and heat.

17. A method according to claim 16, wherein said adhesive is a fluorinated ethylene/propylene thermoplastic adhesive.

18. A method of forming an electrically and mechanically sound joint between internal layers of a multi-layer plated through hole printed circuit board comprising the steps of:
applying a coating of a noble metal to the layer surfaces to be joined;
polishing the noble metal coating;
juxtaposing the noble metal coated surfaces; and
exposing the juxtaposed layers to a pressure from about 100 psi to about 10,000 psi and a temperature from about 400 to about 1000 degrees F. until the noble metal coated surfaces bond to form an electrically and mechanically sound metal to metal joint.

19. A method according to claim 18, wherein said polishing is effected by brushing the noble metal coated surface with a slurry of fine particles selected from the group consisting of pumice and alumina.

20. A method according to claim 1, wherein an electrical circuit element on one circuit board layer is electrically connected to at least one other electrical circuit element on a remote side of another circuit board layer.

21. A method acording to claim 1, comprising additional steps of masking portions of said circuit board layers prior to applying said noble metal coating and removing the masking after application of the noble metal coating.

22. A method according to claim 21, wherein said masking is effected by applying a polymeric etching resist over selected portions of said circuit board layers, and said masking is removed by subjecting the coated layers to vapor degreasing.

23. A method according to claim 1, wherein said pressure lies in the range from about 200 to about 1000 psi and said temperature lies in the range from about 450 to about 600 degrees F.

24. A method according to claim 23, wherein said pressure lies in the range from about 490 to about 575 psi and said temperature lies in the range from about 500 to about 580 degrees F.

25. A multi-layer plated through hole printed circuit board with buried through hole interconnections produced by a process comprising the steps of:
applying a coating of a noble metal to layer surfaces to be conductively joined on the through hole board layers;
juxtaposing the noble metal coated surfaces on the through hole board layers;
applying a layer of thermal adhesive over the outer surfaces of the juxtaposed through hole board layers;
juxtaposing imperforate outer board layers over the adhesive layers; and
exposing the juxtaposed layers to a pressure from about 100 psi to about 10,000 psi and a temperature from about 400 to about 1000 degrees F. until the noble metal coated surfaces bond to form an electrically and mechanically sound metal to metal joint and thermal adhesive is extruded into the through holes of the internal through hole board layers.

* * * * *